US012288703B2

(12) United States Patent
Hung et al.

(10) Patent No.: US 12,288,703 B2
(45) Date of Patent: *Apr. 29, 2025

(54) WAFER PROCESS MONITORING SYSTEM AND METHOD

(71) Applicant: Taiwan Semiconductor Manufacturing Co., Ltd., Hsinchu (TW)

(72) Inventors: Ming-Sung Hung, Hsinchu (TW); Chia-Lun Chen, Hsinchu (TW); Cheng-Hao Kuo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/365,766

(22) Filed: Aug. 4, 2023

(65) Prior Publication Data

US 2023/0411190 A1    Dec. 21, 2023

Related U.S. Application Data

(63) Continuation of application No. 17/111,796, filed on Dec. 4, 2020, now Pat. No. 11,817,336.

(60) Provisional application No. 62/951,957, filed on Dec. 20, 2019.

(51) Int. Cl.
*H01L 21/67* (2006.01)
*G01H 17/00* (2006.01)
*H01L 21/66* (2006.01)

(52) U.S. Cl.
CPC ....... *H01L 21/67253* (2013.01); *G01H 17/00* (2013.01); *H01L 22/34* (2013.01); *G05B 2219/37435* (2013.01)

(58) Field of Classification Search
CPC ... H01L 21/67253; H01L 22/34; H01L 22/12; H01L 21/67288; H01L 21/67075; H01L 21/67259; G01H 17/00; G05B 2219/37435
See application file for complete search history.

(56) References Cited

U.S. PATENT DOCUMENTS

| | | | |
|---|---|---|---|
| 6,119,367 A * | 9/2000 | Kamikawa | H01L 21/67034 34/179 |
| 6,298,282 B1 * | 10/2001 | Guldi | G05B 19/4061 340/3.3 |
| 8,483,870 B2 | 7/2013 | Morita | |
| 10,500,876 B2 | 12/2019 | Verheijen et al. | |
| 2005/0246124 A1 | 11/2005 | Tomer et al. | |
| 2006/0112978 A1 | 6/2006 | Jegal | |
| 2007/0001638 A1 * | 1/2007 | Gray | B25J 9/1692 318/568.11 |

(Continued)

FOREIGN PATENT DOCUMENTS

| | | |
|---|---|---|
| CN | 101807059 A | 8/2010 |
| CN | 103311166 A | 9/2013 |

(Continued)

*Primary Examiner* — Tarun Sinha
(74) *Attorney, Agent, or Firm* — Seed IP Law Group LLP

(57) ABSTRACT

The present disclosure provides a system and method for determining condition of wafers during processing of the wafers. The system and method include detecting vibrations of a wafer transfer robot, generating signals based upon the vibrations, and processing the signals for determining a condition of the wafers held by the wafer transfer robot.

20 Claims, 4 Drawing Sheets

(56) References Cited

U.S. PATENT DOCUMENTS

2014/0208850 A1* 7/2014 Kim .................. H01L 21/67288
73/587

FOREIGN PATENT DOCUMENTS

| CN | 106605453 A | 4/2017 |
|---|---|---|
| TW | 379382 B | 1/2000 |
| TW | 201041072 A | 11/2010 |
| TW | 201340239 A | 10/2013 |
| TW | 201625426 A | 7/2016 |

* cited by examiner

WAFER PROCESS MONITORING SYSTEM AND METHOD

BACKGROUND

Integrated circuit (IC) fabrication utilizes a variety of processing steps, including etching and depositing films (i.e., layers) on masked wafers in order to create trenches, vias, metal lines, components of passive and active electrical circuits, such as capacitors, resistors, inductors, transistors, antennas, and in general forming insulating and conducting structures in the production of integrated circuits on batches of wafers formed of semiconductor substrate material.

Often, processing steps are performed via automated or at least semi-automated systems in a linear assembly-line fashion. Processing steps may include cleaning, etching, rinsing, and/or depositing material on the wafers in chambers or individual tanks of solutions. Wafers may be moved into and out of processing solutions contained in different tanks, thus requiring placing the wafers on, and removing the wafers from, tank transport devices or mechanisms, as well as moving the wafers between different tank transport devices. That is, wafers may be automatically moved, transported and/or transferred multiple times during wafer processing that typically involves exposure of the wafers to high/low temperatures, temperature changes, high/low pressures, pressure changes, and different chemical agents. Thus, the wafers may incur stresses and even strains during processing of the wafers, as well as during transport/transfer of the wafers accompanying the processing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
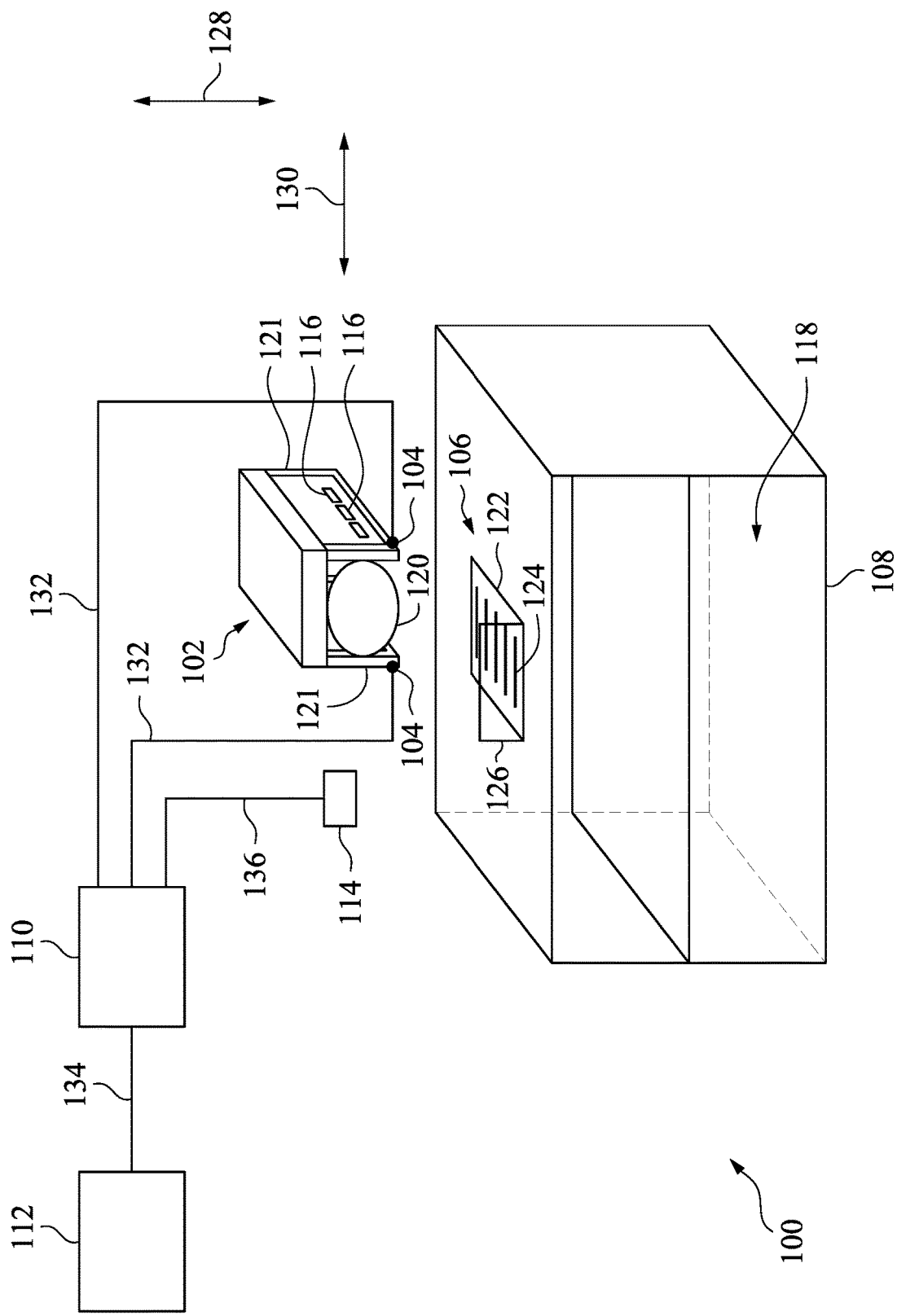
FIG. 1 illustrates a system for determining condition of wafers during processing of the wafers, according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "vertical," horizontal" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Wafers may undergo forces, such as stresses, as well as relative molecular movement, e.g., strain, during IC fabrication steps. For example, the forces and resulting strain may be caused by exposure of the wafers to chemical processes, such as chemical baths, electric currents, high/low pressures, pressure changes, high/low temperatures, temperature changes, ion bombardment, doping, oxidation, metallization, and other fabrication processes. Many fabrication processes may be automated or semi-automated by mechanical systems or devices, including robotic or other automated devices that may subject the wafers to addition stresses and strains caused by the handling, transfer and/or transport of the wafers.

Wafers may suffer physical damage during or between different processing steps, such as being cracked or broken. Furthermore, wafers can become incorrectly positioned in automated devices while being transferred from one device to another device, or as a result of transporting wafers in an automated device as the device moves the wafers from one location in a processing assembly line to another location in the processing assembly line. In addition, wafers may go missing from an automated device used to hold a batch of wafers, transport the wafers, and/or transfer the wafers to other devices.

For example, when performing wet etch process steps on wafers using wet benches, a first mechanized automated subsystem of the wet bench may move batches of wafers into and out of different chemical solutions (also referred to as chemical baths), and a second mechanized automated subsystem may transport the batch of wafers to locations near components of the first subsystem and then transfer the batch of wafers to the components of the first subsystem and collect the wafers from the components of the first subsystem. Wafers may suffer damage while in the chemical baths, being placed in or removed from the chemical baths, during transfer of the wafers between the first and second automated subsystems, and/or during transport of the wafers by the first and/or second automated subsystems. The chemical baths are typically held in processing tanks or chambers. If one or more wafers is physically damaged, or incorrectly held or positioned within an automated system because of a faulty transfer between the automated systems, wafers may fall out (i.e., go missing) from the automated system. For example, damaged or misoriented wafers being held by components of an automated system may fall into the processing tanks or remain in the processing tanks.

It would be advantageous to accurately determine the condition of wafers while being processed by a wafer processing system, such as determining if one or more wafers have been damaged and/or incorrectly positioned in, or missing from, components of the system designed to transfer/transport wafers during processing, so that processing can be stopped to avoid contamination and/or damage to other wafers being processed by the system and/or to avoid damage to components of the automated system itself.

FIG. 1 illustrates a system 100 for determining condition of wafers during processing of the wafers, according to an embodiment of the present disclosure. The system 100 includes a wafer transfer robot 102 and one or more vibration sensors 104. The system 100 may optionally include at least one of one or more wafer lifts 106, one or more processing regions 108, a processing module 110, a monitor 112, one or more optical sensors 114 and one or more wafer count sensors 116. The processing region 108 may be defined by an enclosure, such as a processing container (e.g., a processing tank or a processing chamber), or any other region in which one or more processing procedures are performed on wafers. A processing region may be any region in which one or more processing parameters, such as temperature, pressure, type and concentration of processing agents, may be controlled. In one embodiment, a processing region may contain a chemical bath. In other embodiments, a processing container includes processing tanks and processing chambers of deposition systems, such as chemical vapor deposition (CVD) and physical vapor deposition (PVD) systems. For purpose of the following discussion, the one or more processing regions are one or more processing tanks (108), although the scope of the present disclosure covers any type of processing region or processing container. Each processing tank 108 may contain one or more wafer processing agents that form a chemical bath 118. Processing agents may include any solution that is used in the processing of wafers, including ionized water for rinsing. In one embodiment, the chemical bath may be used in an IC fabrication procedure performed on semiconductor wafers, such as a wet etch, a rinse or a chemical deposition of material on the wafers. However, the scope of the present disclosure includes all types of processing procedures performed on semiconductor wafers, including processes performed on wafers formed of insulators and/or metals.

In one embodiment, any combination of the wafer transfer robot 102, the one or more wafer lifts 106, the one or more processing tanks 108, the processing module 110, the monitor 112, and the optical sensor 114 may be components of wafer processing systems, such as semiconductor processing benches. For example, wet benches are used to etch semiconductor wafers in different chemical solutions, also referred to as chemical baths, and other fabrication benches are used for performing other processing procedures for manufacturing semiconductor dies, including integrated circuits, from semiconductor wafers.

The wafer transfer robot 102 is configured to hold one or more wafers 120, including a batch of wafers (not shown). The wafer transfer robot 102 is also configured to place the wafers 120 on the wafer lift 106, remove the wafers 120 from the wafer lift 106, and transport the wafers 120 from a location near one wafer lift (e.g., wafer lift 106) to a location near another wafer lift (not shown) for placing the wafers 120 on, and then removing the wafers 120 from, the other wafer lift. In one embodiment, the wafer transfer robot 102 includes two arms 121 configured for holding the wafers 120. The two arms 121 may be positioned directly opposite one another.

The wafer lift 106 is configured to move the wafers 120 received from the wafer transfer robot 102 into the chemical bath 118, and typically after a given processing time, remove the wafers 120 from the chemical bath 118. In one embodiment, the wafer lift 106 is configured to be lowered into and raised out of the chemical bath 118 for immersing the wafers 120 into and removing the wafers 120 from the chemical bath 118. In one embodiment, the wafer lift 106 is configured to move substantially vertically downward for being lowered into the chemical bath 118 and substantially vertically upward for being raised from the chemical bath 118. In one embodiment, the wafer lift 106 has bottom portion 122 with inscribed slots 124. For example, the bottom portion 122 may be a metallic, ceramic or plastic plate. The size, depth and spacing of the slots 124 are configured such that a single slot may receive a portion of an edge of a single wafer for holding the wafer temporarily in place on the wafer lift 106. The wafer lift 106 may also include a side portion 126 that is configured to be engaged with a vertical transfer means for moving the wafer lift in a substantially vertical direction 128. Vertical transfer means are well known in the art of wafer fabrication and may include robotic arms or other types of electrically powered devices that have components that move substantially vertically.

In one embodiment, the wafer transfer robot 102 is configured to be moved in any direction. Although not shown, the wafer transfer robot 102 may be attached to a robotic arm or other mechanical systems configured to move the wafer transfer robot in any direction. For example, the processing module 110 or other external computers or control modules (not shown) may execute preprogrammed code for directing motion of the wafer transfer robot 102, as well as other components, such as the wafer lift 106, during the processing of the wafers 120 in various chemical baths for completion of a processing fabrication cycle, for example.

In one embodiment, the wafer transfer robot 102 is configured to be moved in a substantially horizontal direction 130 and in a substantially vertical direction 128. For example, and as illustrated, the wafer transfer robot 102, holding the wafers 120, is positioned at a location near the wafer lift 106. The wafer transfer robot 102 may then be moved in a substantial vertically downward direction for placement adjacent to, or placement circumferentially surrounding, the wafer lift 106.

Figure 2A:
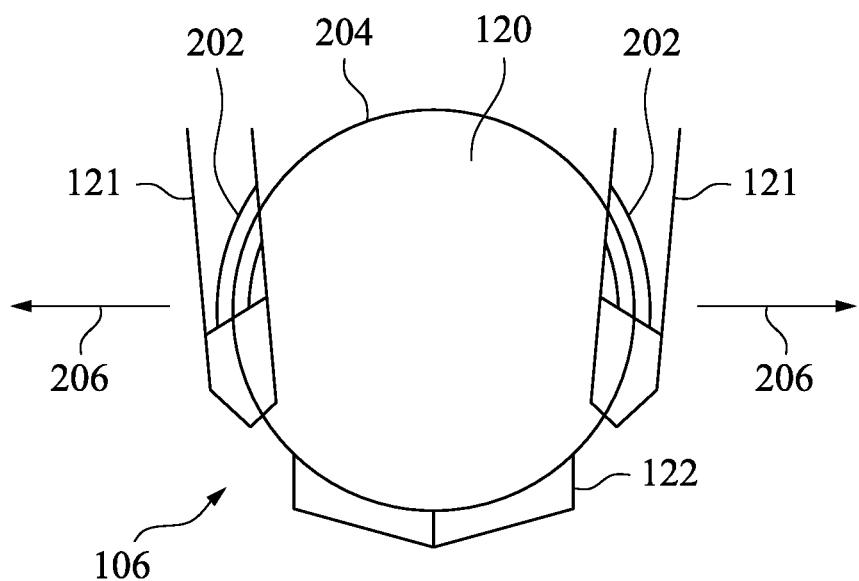
FIG. 2A illustrates an end view of the arms of the wafer transfer robot of FIG. 1 in proximity to a bottom portion of the wafer lift of FIG. 1, according to an embodiment of the present disclosure.
Figure 2B:
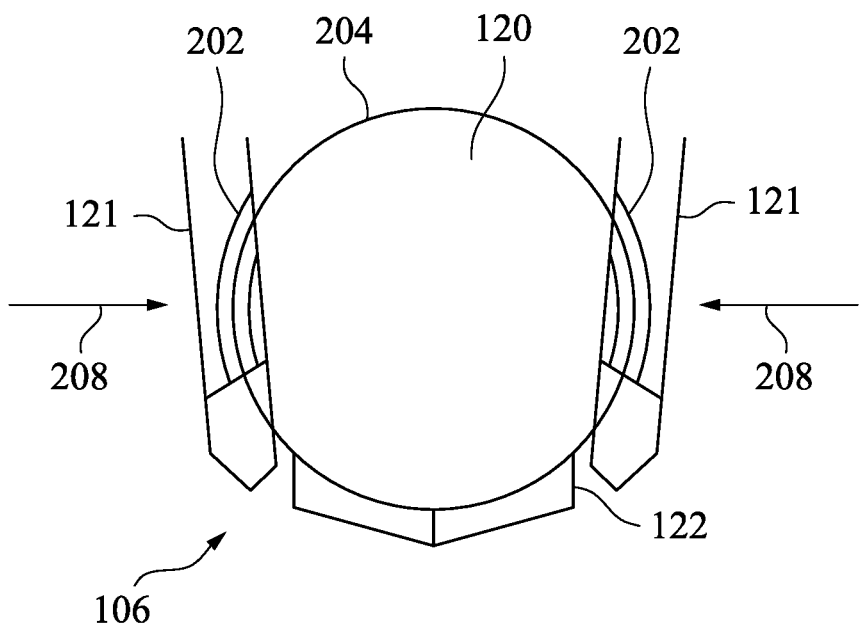
FIG. 2B illustrates an end view of the arms of the wafer transfer robot of FIG. 1 in proximity to a bottom portion of the wafer lift of FIG. 1, according to another embodiment of the present disclosure.

FIGS. 2A and 2B are schematics illustrating an end view of the arms 121 of the wafer transfer robot 102 in proximity to the bottom portion 122 of the wafer lift 106, according to embodiments of the present disclosure. In one embodiment, at least one arm 121 of the wafer transfer robot 102 is configured to be moveable in a substantially horizontal direction, however the scope of the present disclosure covers a wafer transfer robot 102 including two moveable arms 121. At least one arm 121, or alternatively both arms 121, are configured with a plurality of slots 202 (also referred to as grooves) for receiving a portion of an edge 204 of a wafer 120 for holding the wafer 120 in place on the wafer transfer robot 102.

As illustrated by FIG. 2A, the wafer transfer robot 102 has been previously moved in a substantial vertically downward direction for placement of the arms 121 adjacent to the wafer lift 106. Once positioned adjacent to the wafer lift 106, one or both of the arms 121 of the wafer transfer robot 102 are moved substantially horizontally outward 206 (i.e., away from one another), thereby enabling the wafers 120 to dislodge or fall from the wafer transfer robot 102 into position on the bottom portion 122 of the wafer lift 106. In one embodiment, a portion of the edge 204 of the wafer 120 falls into a slot 124 (FIG. 1) inscribed in the bottom portion 122 of the wafer lift 106. Each slot 124 is configured for receiving a portion of the edge 124 of a corresponding wafer such that the corresponding wafer is fixed in an upright position on the bottom portion 122 of the wafer lift 106.

Once the wafer lift 106 has received the wafers 120 from the wafer transfer robot 102, the wafer lift 106 may be lowered in a substantially vertical downward direction for immersion of the wafers 120 in the chemical bath 118. After a predetermined processing time, the wafer lift 106 may be raised in a substantially vertically upward direction for repositioning of the wafer lift 106 in a location near the wafer transfer robot 102.

Once the wafer lift 106 is repositioned near the wafer transfer robot 102, as illustrated by FIG. 2B, one or both of the arms 121 of the wafer transfer robot 102 are moved substantially horizontally inward 208 (i.e., toward one another) for collecting (i.e., removing) the wafers 120 from the wafer lift 106. In one embodiment, as one or both of the arms 121 move substantially horizontally inward 208, the slots 202 in the arms 121 of the wafer transfer robot 102 engage the portion of edge 204 of the wafer 120. In one embodiment, the slots 202 in the arms 121 are designed such that as the arms 121 engage portions of the edges 204 of the wafers 120, the wafers 120 are lifted a small distance vertically upward, thereby disengaging each wafer 120 from its corresponding slot 124 in the bottom portion 122 of the wafer lift 106. In another embodiment, the wafers 120 are disengaged from the slots 124 in the bottom portion 122 of the wafer lift 106 as the wafer transfer robot 102 is moved in a substantially vertically upward direction away from the wafer lift 106.

Once the wafer transfer robot 102 has moved a sufficient vertically upward distance (e.g., a sufficient distance to clear all lifts 106 and other components that may be attached to the processing tanks 108, the wafer transfer robot 102 may be moved in a substantially horizontal direction 130 for placement in a location near another wafer lift corresponding to another processing tank for performing a next processing procedure on the wafers 120 of the wafer transfer robot 102.

When wafers are processed with liquids, gases or solids, including conventional semiconductor processes, they may be subject to stresses and resultant strains causes by exposure to high/low temperatures, rapid temperature changes, high/low pressures, rapid pressure changes, various chemical compounds and/or vibrations. The vibrations may be purposely induced, e.g., vibration of chemical baths as part of a processing step, or induced by transfer of wafers from one mechanical transport/transfer system to another mechanical transport/transfer system. For example, the wafers 120 may be subject to stresses/strains incurred as the wafers 120 are transported by the wafer lift 106 into and out of the chemical baths 118, and by the transfer of the wafers 120 from the wafer transport robot 102 to the wafer lift 106 and/or by the collection of the wafers 120 by the wafer transfer robot 102 from the wafer lift 106. These stresses/strains, singly or in any combination, may change the condition of one or more of the wafers 120, such as causing a wafer 120 to crack or break. If a wafer breaks into one or more portions, some of the portions may fall from the wafer transfer robot 102 into the chemical bath 118, or all of the portions may fall from the wafer transfer robot 102 resulting in the wafer transfer robot 102 having one or more missing wafers. Furthermore, a cracked or broken wafer, and on some occasions, an uncracked, unbroken wafer (i.e., an intact wafer) may not, upon collection by the wafer transfer robot 102 from the wafer lift 106, be held properly by the wafer transport robot 102.

For example, a wafer may be held incorrectly by the wafer transfer robot 102 when a portion of the edge 204 of the wafer 120 to be engaged by the slot 202 of the wafer transfer robot 102 upon collection of the wafer 120 from the wafer lift 106 is not received by the slot 202 or any slot, or is received by an incorrect slot. An incorrect slot is a slot that has received portions of the edges 204 of two or more wafers, for example, or is a slot on one arm 121 of the wafer transfer robot 102 that receives a portion of the edge 204 of a wafer that is not directly opposite a slot on the other opposite arm that has received a portion of the opposite edge of the wafer.

These wafer conditions, such as cracked, broken, incorrectly held wafers, or missing wafers, may affect the subsequent processing of the wafers held by the wafer transfer robot 102 as they are transferred to other wafer lifts for subsequent processing, or may affect a subsequent processing of a new batch of wafers due to the existence of wafers or portions of wafers that have fallen or remained in the chemical bath 118.

In accordance with embodiments described herein, one or more vibration sensors 104 are attached to the wafer transfer robot 102. In one embodiment, the vibration sensor 104 is attached to one arm 121 of the wafer transfer robot 102, or alternatively, one vibration sensor 104 is attached to each arm 121 of the wafer transfer robot 102.

The vibration sensor 104 is configured to detect vibrations of the wafer transfer robot 102. Although the vibration sensor 104 may detect vibrations of the wafer transfer robot 102 any time during operation of the wafer transfer robot 102, the vibrations detected after the wafer transfer robot 102 removes (i.e., collects) the wafers 120 from the wafer lift 106 may be particularly of interest. In one embodiment, the vibration sensor 104 is an inertial-based motion detector for detecting motion, such as vibrational motion. In some embodiments, the vibration sensor 104 includes an accelerometer, gyroscope components, one or more other suitable components, or a combination thereof.

According to an embodiment of the present disclosure, the vibration sensor 104 detects the vibrations of the wafer transfer robot 102 and generates signals based on the detected vibrations. The scope of the present disclosure covers vibration sensors that include a microprocessor or CPU that processes the detected vibrations to generate electrical signals, such as current, voltage or magnetic signals, and other vibration sensors that may not include a processor, but may include components formed of materials, such as piezoelectric materials, that generate electrical signals from their vibrational motion.

The processing module 110 may include one or more processors, CPUs, microcontrollers, memory, ADC/DAC units and associated logic circuitry and/or firmware for digital and/or analog signal processing. In one embodiment, the processing module 110 is configured to receive the signals from the vibration sensor 104 and process the signals. For example, the processing module 110 may process the signals for display on the monitor 112 as a time series or a frequency spectrum. The processing module 110 may alternatively, or in addition to displaying the processed signals, compare the processed signals or patterns of the processed signals in the frequency and/or time domain with signals or patterns of signals stored in a memory. Each signal or signal pattern stored in memory may be associated with a corresponding cause of the signal, also stored in memory.

Figure 3A:
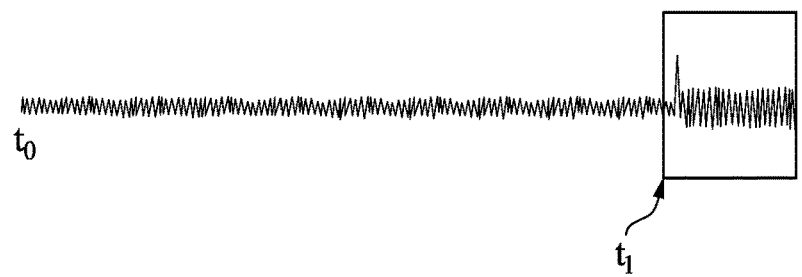
FIG. 3A illustrates a time series of vibrations of the wafer transfer robot as illustrated on the monitor of FIG. 1, according to an embodiment of the present disclosure.

For example, FIG. 3A illustrates a time series of vibrations of the wafer transfer robot 102 as illustrated on the monitor 112, according to an embodiment of the present disclosure. From t=0 to t=t1, the wafer transfer robot 102 is being moved to be positioned for collecting wafers 120 from the wafer lift 106, at t=t1 the wafer transfer robot 102 collects the wafers 120 from the wafer lift 106, and for times greater than t=t1 the wafer transfer robot 102 is being moved away from the wafer lift 106. The spike in the vibrations at t=t1 indicate the collection (i.e., removal) of the wafers 120 from the wafer lift 106, and the smaller vibrations occurring for times greater than t=t1 indicate the damping of the initial vibration caused by the collection event at t=t1. FIG. 3A does not indicate that any of the wafers are broken, cracked, missing or held incorrectly by the wafer transfer robot 102.

Figure 3B:
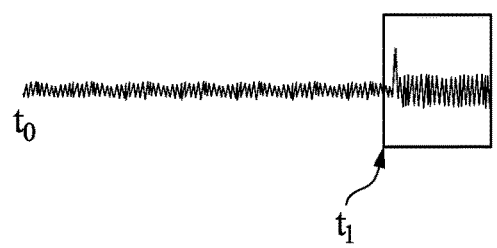
FIG. 3B illustrates a time series of vibrations of the wafer transfer robot as illustrated on the monitor of FIG. 1 depicting a broken wafer being held by the wafer transfer robot, according to an embodiment of the present disclosure.

FIG. 3B illustrates a time series of vibrations of the wafer transfer robot 102 as illustrated on the monitor 112 depicting a broken wafer being held by the wafer transfer robot 102, according to an embodiment of the present disclosure. The collection event is indicated by the spike in the vibrations at t=t1, however, the pattern of spikes at time t>t1 indicate that a wafer being held by the wafer transfer robot 102 is broken.

Figure 3C:
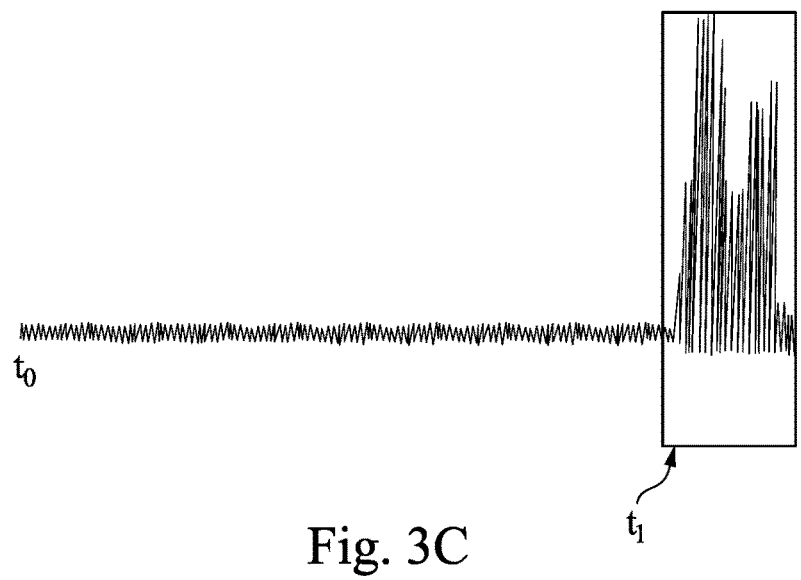
FIG. 3C illustrates a time series of vibrations of the wafer transfer robot as illustrated on the monitor of FIG. 1 depicting a wafer being missing from the wafer transfer robot, according to an embodiment of the present disclosure.

FIG. 3C illustrates a time series of vibrations of the wafer transfer robot 102 as illustrated on the monitor 112 depicting a wafer being missing from the wafer transfer robot 102, according to an embodiment of the present disclosure. The collection event is indicated by the spike in the vibrations at t=t1, however, the pattern of spikes at t>t1 indicate that a wafer is missing from the wafer transfer robot 102 after the wafer transfer robot 102 has collected the wafers 120 from the wafer lift 106. Thus, it is likely that the missing wafer, or at least portions of the missing wafer, may be in the chemical bath 118 of the processing tank 108 corresponding to the wafer lift 106.

Although the processing module 110 may process the signals received from the vibration sensor 104 for display as a time series, the processing module 110 may generate a frequency spectrum of the time series and analyze the frequency spectrum or a combination of the frequency spectrum and the time series. In other embodiments, the processing module 110 may analyze the processed signals in conjunction with signals or signal patterns stored in the memory of the processing module 110 to determine the condition of the wafers being processed and/or being held by the wafer transfer robot 102.

Referring back to FIG. 1, the vibration sensor 104 may be communicatively coupled to the processing module 110 via a wired connection 132. However, the scope of the present disclosure includes wireless communication between the vibration sensor 104 and the processing module 110.

The monitor 112 may be communicatively coupled to the processing module 110 via either a wired connection 134 or wirelessly. In one embodiment, when the processing module 110 determines that the condition of wafers 120 being held by the wafer transfer robot 102 includes at least one wafer being cracked, broken, held incorrectly, and/or missing, the processing module 110 generates an alert signal for display on the monitor 112. The alert signal alerts an operator, thereby allowing the operator to halt the current fabrication processing steps such that missing wafers may be removed from processing tanks, broken and/or cracked wafers may be removed from the wafer transfer robot 102 and incorrectly held wafers may be adjusted such they are correctly held by the wafer transfer robot 102. Furthermore, the operator may decide, based on the alert signal and the type of wafer condition(s) determined by the processing module 110 and/or after inspecting one or more the processing tanks for missing wafers, to discard all wafers currently being processed and start a new processing cycle with new wafers.

The one or more optical sensors 114 may be communicatively coupled to the processing module 110 via either a wired connection 136 or wirelessly. The optical sensor 114 may be positioned for capturing images of at least one of the chemical baths contained within the one or more processing tanks. In another embodiment, the optical sensor 114 may be configured to capture additional images of the wafer lift 106 and/or the wafer transfer robot 102. In one embodiment, the optical sensor 114 is a charge coupled device. The processing module 110 is configured to process the captured images and/or send the captured images to the monitor 112 for display.

The optical sensors 114 may be used by an operator of the system 100, in combination with the analysis of the vibrations of the wafer transfer robot 102, to determine the condition of the wafers 120 being held by the wafer transfer robot 102. For example, optical sensors 114 have limited resolution, and captured images of the inside of processing tanks that may not be sufficiently illuminated may be difficult to interpret. Furthermore, some chemical baths comprise chemical compounds that may be opaque or partially opaque to light and/or the opacity of some chemical baths may change during the processing of wafers. Furthermore, imaging of the chemical baths may also be hindered by reflection of imaging light from the surface of the chemical baths. In addition, the surface of the baths may have ripples, adding to the difficulty of imaging items, such as wafers or portions of wafers that may be submersed in the baths.

Although optical imaging methods for determining the condition of wafers or the systems for processing the wafers may not always be sufficient and accurate, in accordance with the disclosed embodiments, images captured of the baths contained in the processing tanks may be used in combination with the detected vibrations of the wafer transfer robot 102. For example, results from the optical imaging sensor 114 may be used to assist in training, by associating wafer conditions, such as broken, cracked, missing and/or incorrectly held wafers as determined via an analysis of the detected vibrations and as verified via captured images, with the corresponding vibration signals for creating a table of vibrational signals or patterns of vibration signals in time or frequency space having the corresponding wafer conditions. The table may be stored in a memory of the processing module 110 or a memory external to the processing module 110. In another embodiment, the captured images may be used in combination with the vibrational signals to determine the condition of the wafers 120 on the wafer transfer robot 102 when the vibrational signals are not by themselves determinant of the condition (i.e., state) of the wafers 120.

One or more wafer count sensors 116 may be configured to detect a number of wafers held by the wafer transfer robot 102 and generate a corresponding wafer count signal. In one embodiment, the wafer count sensor 116 is attached to the wafer transfer robot 102, such as one or both arms 121 of the wafer transfer robot 102. The wafer count sensor 116 may include one or more pressure sensors, mechanical sensors and/or electro-mechanical sensors for detecting the presence of a wafer in a corresponding slot of the arm 121 and generating a corresponding wafer count signal. The wafer count sensor 116 may be communicatively coupled to the processing module 110 via wired or wireless connections. The processing module 110 is further configured to receive the wafer count signal from each wafer count sensor 116 and process the wafer count signal(s) for determining the number of the wafers being held by the wafer transfer robot 102. The processing module 110 and monitor 112 may be configured to display the determined number of wafers on the monitor 112 and/or use the determined number of wafers in combination with an analysis of the vibrations of the wafer transfer robot 102 and/or the captured images to determine the condition of the wafers 120 held by the wafer transfer robot 102, and/or for creating a table of vibrational signals or patterns of vibration signals in time or frequency space having the corresponding wafer conditions.

According to an embodiment of the present disclosure, the wafer count sensor 116 includes a plurality of wafer sensors, at least one slot 202 on the arm 121 of the wafer transfer robot 102 includes a wafer sensor for detecting whether the slot 202 contains (i.e., is engaged with) a portion of an edge 204 of a respective wafer. In one embodiment, a wafer sensor is attached to a portion of each slot 202 on the arm 121 of the wafer transfer robot 102. The electromechanical sensor may include a piezoelectric material that generates the count signal when the piezoelectric material is stressed by the force of the wafer against the sensor, thereby causing a strain in the piezoelectric material that results in generation of the count signal.

Figure 4:
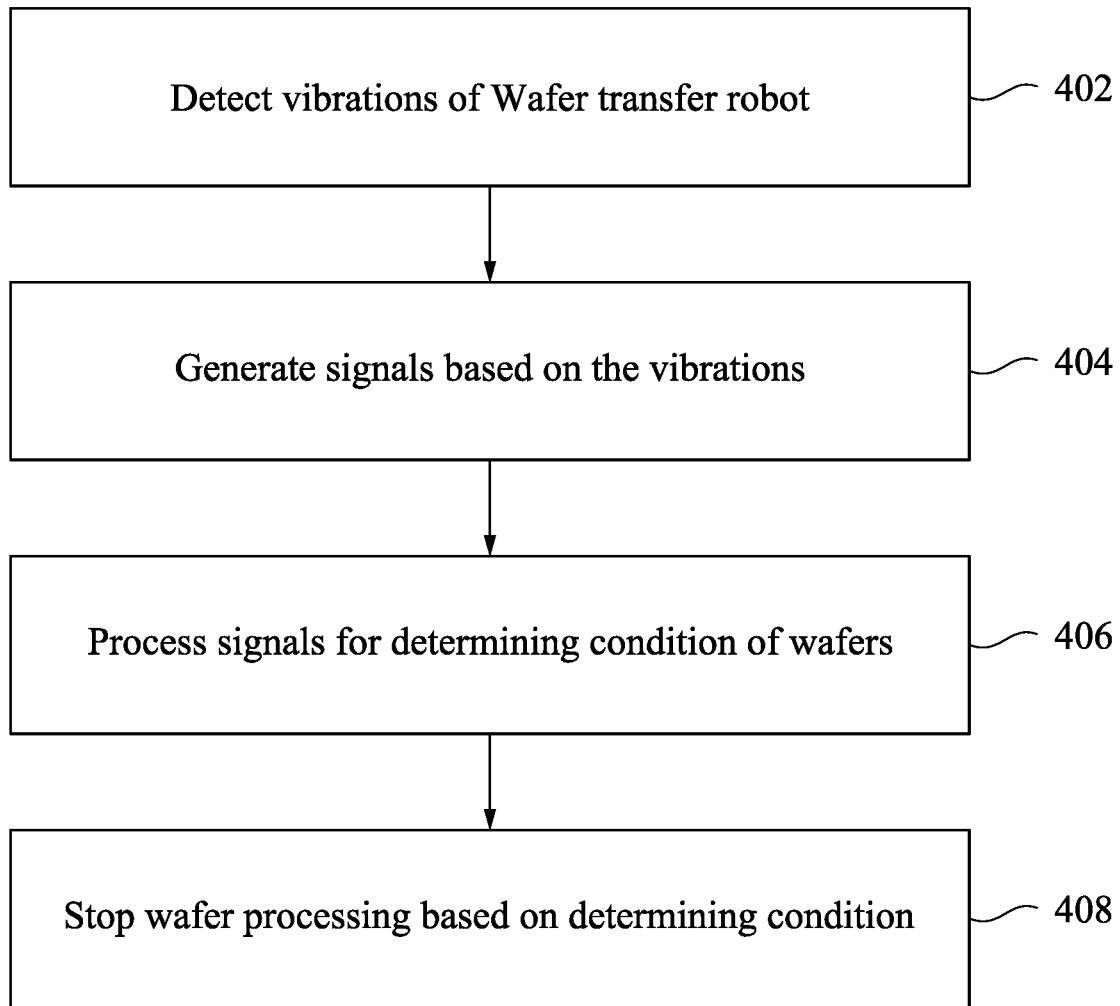
FIG. 4 is a flowchart of a method for determining condition of wafers during processing of the wafers, according to an embodiment of the present disclosure.

FIG. 4 is a flowchart of a method 400 for determining condition of wafers during processing of the wafers, according to an embodiment of the present disclosure. The wafers may be processed by any know semiconductor processing system, including a semiconductor processing bench. Benches are configured for performing one or more processing procedures on batches of semiconductor wafers. The processing procedures may include, but are not limited to, wet etch, rinsing and/or cleaning, for example. However, the scope of the present disclosure covers any type of wafer processing procedures that involve mechanical transfer of wafers to and from processing chambers or processing tanks and/or mechanical transfer of wafers between wafer transport/transfer systems and devices.

A bench may include at least one processing region, such as a processing tank, and a corresponding wafer lift. For the purpose of the following discussion, the one or more processing regions are one or more processing tanks, although the scope of the present disclosure covers any type of processing region or processing container. Each processing tank is configured to perform one or more processing steps, also referred to as processing procedures, on one or more wafers. For example, a processing tank may contain a chemical bath or other fluid agent used to perform a particular processing step or procedure. Each wafer lift is configured for moving the wafers into a corresponding processing tank and moving the wafers out of the corresponding processing tank. In one embodiment, the wafer lift moves the wafer in a substantially vertical direction. The system further includes a wafer transfer robot and a vibration sensor attached to the wafer transfer robot. The wafer transfer robot is configured for holding the wafers, transferring the wafers to at least one wafer lift and removing the wafers from at least one wafer lift. According to one embodiment, the wafer transfer robot is configured to move the wafers from one wafer lift to another wafer lift. In one embodiment, the wafer transfer robot is configured to move in a substantially vertical direction for placing the wafers on, and/or removing the wafers from, a wafer transfer lift, and move in a substantial horizontal direction for moving the wafers from a location near a first wafer transfer lift to a location near a second wafer transfer lift. The wafer transfer robot may then move in a substantially vertical direction for placing the wafers on, and/or removing the wafers from, the second wafer transfer lift.

In step 402 of the method, vibrations of the wafer transfer robot 102 are detected. In one embodiment, one or more vibration sensors 104 detect the vibrations of the wafer transfer robot 102. According to another embodiment, the wafer transfer robot 102 includes at least two arms 121 configured for holding wafers 120, placing wafers on the wafer lift 106 and removing wafers from the wafer lift 106. At least one arm is moveable with respect to the other arm for placing wafers on and removing wafers from the wafer lift 106. In one embodiment, at least one vibration sensor 104 is attached to at least one arm 121 of the wafer transfer robot 102.

In step 404, signals are generated based upon the vibrations. In one embodiment, the vibration sensor 104 is configured to generate the signals based on the detected vibration of the wafer transfer robot 102. The signals may be electrical signals, such a current, voltage, magnetic or electromagnetic signals. The signals may be analog or digital signals, any may represent, for example, an analog or digital time series of the detected vibrations or an analog or digital frequency spectrum of the detected vibrations. In one embodiment, the vibration sensor 104 is an electromechanical sensor that may include gyroscopic components, piezoelectric components and/or accelerometer components, for example.

In step 406, the signals are processed for determining a condition of the wafers 120 held by the wafer transfer robot 102. In one embodiment, the signals are processed by a processing module 110, including, for example, microprocessors, CPUs, microcontrollers, memory, analog/digital converters and digital logic and processing circuitry. Although the scope of the present disclosure covers detecting vibrations, generating signals, and processing the signals at any or all times during operation of the wafer transfer robot 102 and/or system components for processing the wafers 120, according to one embodiment the signals are processed for determining the condition of the wafers 120 held by the wafer transfer robot 102 directly after removal of the wafers 120 from the wafer lift 106 by the wafer transfer robot 102. According to another embodiment of the present disclosure, the signals are processed for determining the condition of the wafers 120 held by the wafer transfer robot 102 during the period of time including removal of the wafers 120 from a first wafer lift by the wafer transfer robot 102, movement of the wafer transfer robot 102 to a location near a second wafer lift, and placement of the wafers 120 on a second wafer lift by the wafer transfer robot 102.

In one embodiment, the condition of the wafers 120 may include one or more wafers being cracked, broken, held incorrectly by the wafer transfer robot 102, and/or missing from the wafer transfer robot 102.

If the method determines that the condition of the wafers 120 include one or more wafers being cracked, broken, held incorrectly by the wafer transfer robot 102, and/or missing from the wafer transfer robot 102, then in step 408, the processing of wafers, including operation of the wafer lift 106 and wafer transfer robot 102 is stopped, and an operator may check the processing tank 108 for any wafers, or portions of wafers, that are missing from the wafer transfer robot 102, adjust positioning of any incorrectly held wafers on the wafer transfer robot 102, remove and/or replace nay cracked or broken wafers from the wafer transfer robot 102, replace any contaminated chemical baths 118 or other solutions held in the processing tanks 108, and/or replace all the wafers being currently processed with a new batch of wafers and repeating one or more of the processing procedures.

The present disclosure provides a system and method for determining condition of wafers during processing of the wafers. The wafers may be processed by semiconductor benches or other systems or components for performing processing procedures on wafers for the fabrication of integrated circuits, for example. The system and method of the present disclosure is not limited to wafer processing but may also be used with any systems that processing objects that are transported and/or transferred by automatic or semi-automatic mechanical systems between various chambers or tanks in which processing procedures are performed.

In one embodiment, a system includes a wafer lift, a wafer transfer robot, a vibration sensor attached to the wafer transfer robot and a processing module communicatively coupled to the vibration sensor. The wafer lift is configured to move at least one wafer into a chemical bath for performing a processing step on the at least one wafer and remove the at least one wafer from the chemical bath. The wafer transfer robot is configured to hold the at least one wafer, place the at least one wafer on the wafer lift, and remove the at least one wafer from the wafer lift. The vibration sensor is configured to detect vibration of the wafer transfer robot during holding or removing of the at least one wafer by the wafer transfer robot and generate signals based upon the vibration. The processing module is configured to process the signals for determining a condition of the at least one wafer.

In another embodiment, a system for use with a semiconductor bench is provided. The semiconductor bench includes at least one semiconductor processing tank and at least one wafer lift. Each semiconductor processing tank contains a chemical bath and each wafer lift is configured for moving wafers into the chemical bath of a corresponding semiconductor processing tank and moving the wafers out of the chemical bath. The system includes a wafer transfer robot configured to hold at least one wafer, place the at least one wafer on a wafer lift and remove the at least one wafer from the wafer lift. The system also includes a vibration sensor attached to the wafer transfer robot and configured to detect vibration of the wafer transfer robot after the wafer transfer robot removes the at least one wafer from the wafer lift, generate signals based upon the vibration, and send the signals to a processing module for determining a condition of the at least one wafer held by the wafer transfer robot after removal from the wafer lift.

In yet another embodiment, a method for determining condition of wafers during processing of the wafers by a wafer processing system is provided. The method includes processing one or more of the wafers in a processing tank, removing the one or more wafers from the processing tank utilizing a wafer lift, receiving the one or more wafers at a wafer transfer robot, detecting vibrations of the wafer transfer robot, generating signals based upon the vibrations and processing the signals for determining a condition of the one or more wafers held by the wafer transfer robot.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A system, comprising:
a wafer lift configured to move at least one wafer into a processing region for performing a processing step on the at least one wafer;
a wafer transfer robot having a first arm and a second arm positioned opposite to the first arm, the wafer transfer robot configured to hold the at least one wafer between the first and second arms and place the at least one wafer on the wafer lift;
a vibration sensor attached to at least one of the first and second arms, and configured to detect vibration of the wafer transfer robot during holding of the at least one wafer by the wafer transfer robot and generate detection signals based upon the vibration, the vibration sensor being communicatively coupled to a processing module; and
a wafer count sensor configured to detect a number of wafers of the at least one wafer placed by the wafer transfer robot on the wafer lift and generate a wafer count signal, the wafer count sensor being communicatively coupled to the processing module;
wherein, the processing module includes a memory, the memory configured to store signal patterns, and the processing module configured to determine a condition of the at least one wafer placed by the wafer transfer robot based on the detection signals, the signal patterns and the wafer count signal.

2. The system of claim 1, wherein the vibration sensor is an inertial-based motion detector.

3. The system of claim 1, wherein the vibration sensor includes an accelerometer or gyroscope components, or a combination of an accelerometer and gyroscope components.

4. The system of claim 1, further comprising an optical sensor communicatively coupled to the processing module.

5. The system of claim 4, wherein the optical sensor is configured to capture images of the wafer lift, the wafer transfer robot or the processing region.

6. The system of claim 1, further comprising a monitor communicatively coupled to the processing module, the processing module is configured to generate an alert signal based on the determine condition of the at least one wafer placed by the wafer transfer robot, and the monitor is configured to display the alert signal.

7. The system of claim 1, wherein the at least one of the first and second arms having a plurality of slots, each slot configured to receive a portion of an edge of a wafer of the at least one wafer when the at least one of the first and second arms of the wafer transfer robot are holding the at least one wafer.

8. The system of claim 1, wherein the wafer count sensor comprises a plurality of wafer sensors, and wherein each slot includes a wafer sensor configured to detect whether the slot contains a portion of an edge of a respective wafer.

9. The system of claim 1, wherein the vibration sensor includes first and second vibration sensors, the first vibration sensor is attached to the first arm and the second vibration sensor is attached to the second arm.

10. A system for use with a semiconductor bench, the semiconductor bench including at least one semiconductor processing region and at least one wafer lift, each wafer lift configured to move wafers into the processing region of a corresponding semiconductor processing tank and move the wafers out of the processing region, the system comprising:
- a wafer transfer robot configured to hold at least one wafer and place the at least one wafer on a wafer lift;
- a wafer count sensor configured to detect a number of wafers of the at least one wafer held by the wafer transfer robot, generate a wafer count signal and send the wafer count signal to a processing module; and
- a vibration sensor attached to the wafer transfer robot and configured to detect vibration of the wafer transfer robot as the wafer transfer robot holds the at least one wafer, generate a vibration signal based upon the vibration, and send the vibration signal to the processing module, the processing module configured to determine a condition of the at least one wafer held by the wafer transfer robot based on the wafer count signal vibration signal.

11. The system of claim 10, wherein the vibration sensor is in inertial-based motion detector.

12. The system of claim 10, wherein the vibration sensor includes an accelerometer or gyroscope components, or a combination of an accelerometer and gyroscope components.

13. The system of claim 10, further comprising an optical sensor communicatively coupled to the processing module.

14. The system of claim 13, wherein the optical sensor is configured to capture images of the wafer lift, the wafer transfer robot or the processing region.

15. The system of claim 10, further comprising a monitor communicatively coupled to the processing module, the processing module is configured to generate an alert signal based on the determine condition of the at least one wafer placed by the wafer transfer robot, and the monitor is configured to display the alert signal.

16. The system of claim 10, wherein the wafer transfer robot includes a first arm and a second arm positioned opposite to the first arm, the wafer transfer robot configured to hold the at least one wafer between the first and second arms and place the at least one wafer on the wafer lift, and the at least one of the first and second arms having a plurality of slots, each slot configured to receive a portion of an edge of a wafer of the at least one wafer when the at least one of the first and second arms of the wafer transfer robot are holding the at least one wafer.

17. The system of claim 16, wherein the wafer count sensor comprises a plurality of wafer sensors, and wherein each slot includes a wafer sensor configured to detect whether the slot contains a portion of an edge of a respective wafer.

18. A method for determining condition of wafers during processing of the wafers by a wafer processing system, the method comprising:
- holding one or more wafers between a first arm and a second arm of a wafer transfer robot, the first arm being opposite to the second arm;
- detecting vibration of the wafer transfer robot by a vibration sensor attached to one of the first and second arms;
- generating a detection signal based upon the detected vibration;
- detecting a number of the one or more wafers held by the wafer transfer robot;
- generating a wafer count signal based on the number of wafers detected;
- processing the detection signal and the wafer count signal by a processing module, the processing module having a memory, and the memory including signal patterns; and
- determining, by the processing module, based on the detection signal, signal patterns and the wafer count signal, a condition of the one or more wafers held by the wafer transfer robot.

19. The method of claim 18, wherein the condition of the one or more wafers comprises one or more wafers being cracked, broken, held incorrectly by the wafer transfer robot and/or missing from the wafer transfer robot.

20. The method of claim 18, further comprising capturing images of the one or more wafers held by the wafer transfer robot, and wherein the processing the detection signal comprises processing the detection signal and the captured images for determining the condition of the one or more wafers held by the wafer transfer robot.

* * * * *